United States Patent
Lee et al.

(10) Patent No.: US 6,661,722 B2
(45) Date of Patent: Dec. 9, 2003

(54) LAYOUT METHOD FOR BIT LINE SENSE AMPLIFIER DRIVER

(75) Inventors: Jae-young Lee, Seoul (KR); Jong-hyun Choi, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/190,652

(22) Filed: Jul. 8, 2002

(65) Prior Publication Data

US 2003/0016059 A1 Jan. 23, 2003

(30) Foreign Application Priority Data

Jul. 20, 2001 (KR) ........................................ 2001-43790

(51) Int. Cl.[7] ............................................... G11C 7/00
(52) U.S. Cl. .................... 365/205; 365/203; 365/204; 365/207; 365/226; 365/208; 365/63
(58) Field of Search ........................... 365/189.01, 203, 365/204, 205, 207, 208, 226, 63

(56) References Cited

U.S. PATENT DOCUMENTS

| | | | | |
|---|---|---|---|---|
| 5,321,646 A | * | 6/1994 | Tomishima et al. | 365/51 |
| 6,339,358 B1 | * | 1/2002 | Horiguchi et al. | 327/544 |
| 6,404,056 B1 | * | 6/2002 | Kuge et al. | 257/758 |
| 6,466,502 B1 | * | 10/2002 | Matsumoto | 365/208 |
| 2001/0013662 A1 | * | 8/2001 | Kudou et al. | 257/784 |
| 2002/0196690 A1 | * | 12/2002 | Matsumoto | 365/208 |

* cited by examiner

Primary Examiner—Viet Q. Nguyen

(74) Attorney, Agent, or Firm—F. Chau & Associates, LLP

(57) ABSTRACT

A bit line sense amplifier is provided. The bit line sense amplifier includes a first sense amplifier block in which a plurality of first sense amplifiers for sensing and amplifying data of a bit line or a complementary bit line are laid out, and first drivers, which are arranged outside the plurality of first sense amplifiers, for pulling down the bit line or the complementary bit line to a first voltage level. The bit line sense amplifier further includes a second sense amplifier block with a plurality of second sense amplifiers and second drivers for pulling up the bit line or the complementary bit line to a second voltage level. By arranging the drivers outside the bit sense amplifiers, effects caused by variation in critical dimensions (CDs) of gates are minimized and the entire area of the bit line sense amplifier is reduced.

8 Claims, 5 Drawing Sheets

LAYOUT METHOD FOR BIT LINE SENSE AMPLIFIER DRIVER

PRIORITY

This application claims priority to an application entitled "LAYOUT METHOD FOR BIT LINE SENSE AMPLIFIER DRIVER" filed in the Korean Industrial Property Office on Jul. 20, 2001 and assigned Serial No. 2001-43790, the contents of which are hereby incorporated by reference.

BACKGROUND OF THE INVENTION

1. Field of the Invention

The present invention relates to semiconductor circuits, and more particularly, to a layout method for a sense amplifier and a sense amplifier driver.

2. Description of the Related Art

In general, a bit line sense amplifier senses, amplifies, and outputs data of a memory cell selected by an address.

FIG. 1 is a circuit diagram of a conventional bit line sense amplifier. Referring to FIG. 1, a bit line sense amplifier 1 used in a DRAM includes a plurality of NMOS sense amplifiers 3 and a plurality of PMOS sense amplifiers 7 that are arranged symmetrically for maximization of characteristics. Hereinafter, for the convenience of explanation, one NMOS sense amplifier 3 and one PMOS sense amplifier 7 will be described.

The NMOS sense amplifier 3 includes NMOS transistors N1 and N3 for sensing data of bit lines BL0–BL2 and complementary bit lines BLB0–BLB2 respectively, and a first driver N5 for driving a ground voltage VSSA to a node ND in response to an enabling signal LANG. The PMOS sense amplifier 7 includes PMOS transistors P1 and P3 for sensing data of the bit lines BL0–BL2 and the complementary bit lines BLB0–BLB2 respectively, and a second driver P5 for driving a supply voltage VDD to the PMOS transistors P1 and P3 in response to an enabling signal LAPG.

FIG. 2 is a plan view of the layout of the conventional NMOS sense amplifier. Referring to FIGS. 1 and 2, the layout of the conventional NMOS sense amplifier 3 will be described below.

A gate G3 of the first driver N5 is arranged to have a ring shape, and the bit line BL0 is in contact with a gate G2 of the NMOS transistor N3 through a contact MC3, where the contact is a known electrical connecting means, and in contact with the NMOS transistor N1 through a contact MC1.

The complementary bit line BLB0 is in contact with a gate G1 of the NMOS transistor N1 through a contact MC4 and in contact with the NMOS transistor N3 through a contact MC2. The node ND to which the ground voltage VSSA is supplied is connected to an active region of the first driver N5 through a metal line LAB and a contact MC6.

Further, an enabling signal transmission line LANGL for transmitting the enabling signal LANG is in contact with the gate G3 of the first driver N5 through a contact MC5, and a ground voltage transmission line VSSAL is in contact with the active region of the first driver N5 through a contact MC7.

Resistance mismatch occurs in the conventional bit line sense amplifier 1 due to a difference in the distance from a gate of a column select line (not shown) to the bit line BL0 or to the complementary bit line BLB0.

In a case where the first driver N5 is laid out between the NMOS transistors N1 and N3, variation in a critical dimension (hereinafter referred to as CD) of gates occurs between the gates G1, G2, G4, and G5, which are laid out near the gate G3, and gates G6 and G7, which are laid out far from the gate G3.

Since a difference in distance occurs between the laid out gates, for example, between the gates G1 and G2 and the gates G6 and G7, a difference in coupling of the gate G3 of the first driver N5 occurs.

Further, since the contact MC6 is connected to the active region of the first driver N5, which has a large area, due to an increase in junction loading, noise occurs when the bit line sense amplifier senses data.

SUMMARY OF THE INVENTION

To solve the above problems, it is an objective of the present invention to provide a bit line sense amplifier having a layout in which variation in a critical dimension (CD) of gates of transistors for forming a bit line sense amplifier is minimized and in which an active region of a driver for supplying power to the bit line sense amplifier is reduced.

Accordingly, to achieve the above and other objects, there is provided a bit line sense amplifier. The bit line sense amplifier includes a first sense amplifier block in which a plurality of first sense amplifiers for sensing and amplifying data of a bit line or a complementary bit line are laid out, and first drivers for pulling down the bit line or the complementary bit line to a first voltage level, which is lower than a pre-charge voltage in response to a first control signal, and each of the first drivers is arranged outside the plurality of first sense amplifiers.

The bit line sense amplifier further includes a second sense amplifier block in which a plurality of second sense amplifiers for sensing and amplifying data of the bit line or the complementary bit line are laid out, and second drivers for pulling up the bit line or the complementary bit line to a second voltage level, which is higher than the pre-charge voltage, in response to a second control signal, and each of the second drivers is arranged outside the plurality of second sense amplifiers.

The bit line or the complementary bit line includes a global power supply transmission line arranged in the same direction as the bit line, and a local power supply transmission line electrically connected to the global power supply transmission line and arranged at a predetermined degree to the global power supply transmission line, and the bit line or the complementary bit line is pulled down to the first voltage level through the first drivers.

The first sense amplifier includes a first node, a first transistor having a gate connected to the complementary bit line, a first terminal connected to the bit line, and a second terminal connected to the first node, and a second transistor having a gate connected to the bit line, a first terminal connected to the complementary bit line, and a second terminal connected to the first node, and the first drivers include a third transistor having a gate that receives the first control signal, a first terminal connected to the first node, and a second terminal that receives the first voltage level, wherein the gate of the third transistor having a T-shape or an L-shape is laid out on a given active region, and wherein the first voltage level is transmitted to the second terminal of the third transistor through the global power supply transmission line laid out in the same direction as the bit line and the local power supply transmission line laid out perpendicular to the global power supply transmission line and is transmitted to the first node through the first terminal of the third transistor.

The bit line or the complementary bit line includes a global power supply transmission line arranged in the same direction as the bit line, and a local power supply transmission line electrically connected to the global power supply transmission line and arranged at a predetermined degree to the global power supply transmission line, and the bit line or the complementary bit line is pulled up to the second voltage level through the second drivers.

The second sense amplifier includes a second node, a fourth transistor having a gate connected to the complementary bit line, a first terminal connected to the bit line, and a second terminal connected to the first node, and a fifth transistor having a gate connected to the bit line, a first terminal connected to the complementary bit line, and a second terminal connected to the first node, and the second drivers include a sixth transistor having a gate that receives the second control signal, a first terminal connected to the first node, and a second terminal that receives the second voltage level, wherein the gate of the sixth transistor having a T-shape or an L-shape is laid out on a given active region, and wherein the second voltage level is transmitted to the second terminal of the sixth transistor through the global power supply transmission line laid out in the same direction as the bit line and the local power supply transmission line laid out perpendicular to the global power supply transmission line and is transmitted to the second node through the first terminal of the sixth transistor.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS OF THE INVENTION

Figure 1:
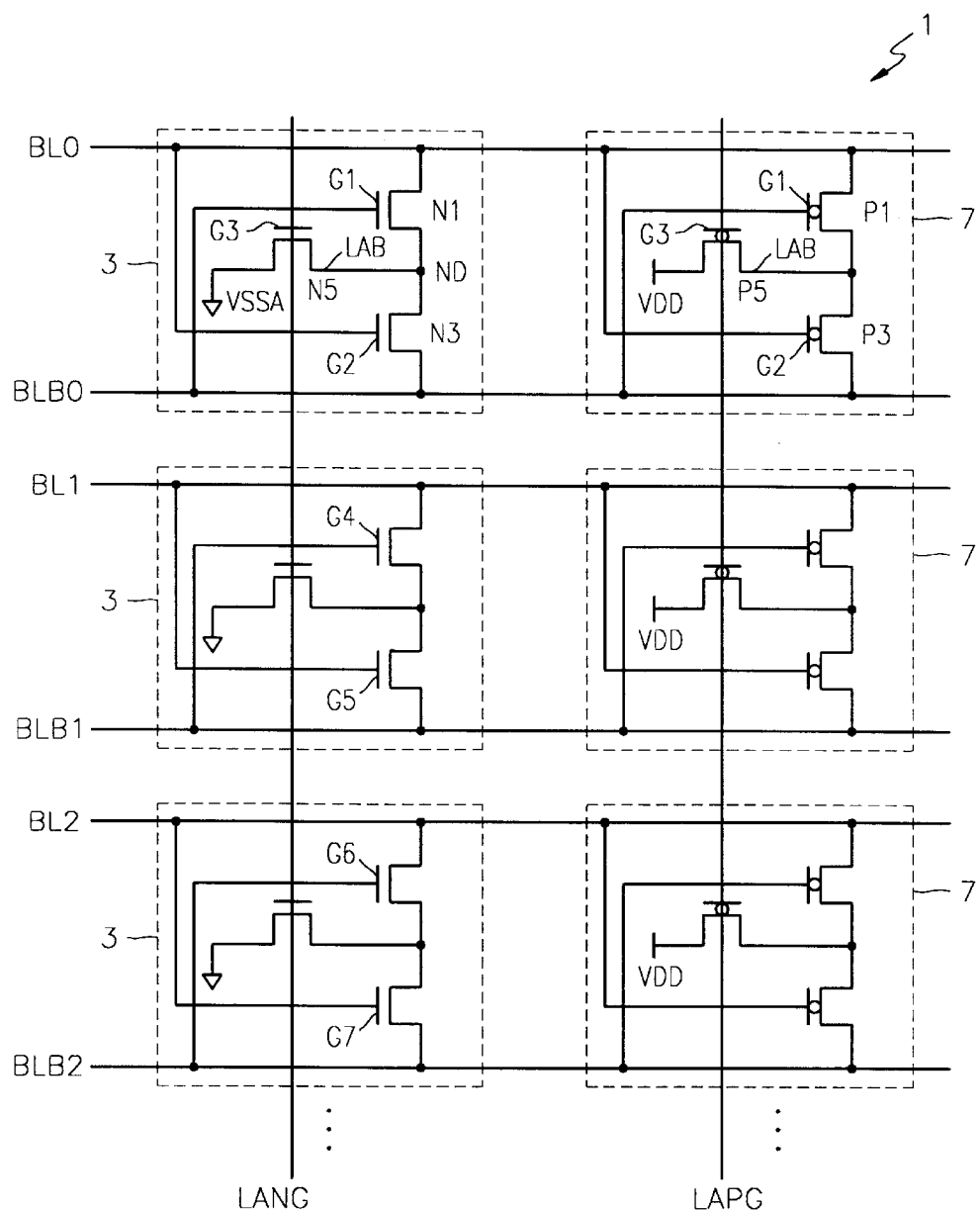
FIG. 1 is a circuit diagram of a conventional bit line sense amplifier.
Figure 2:
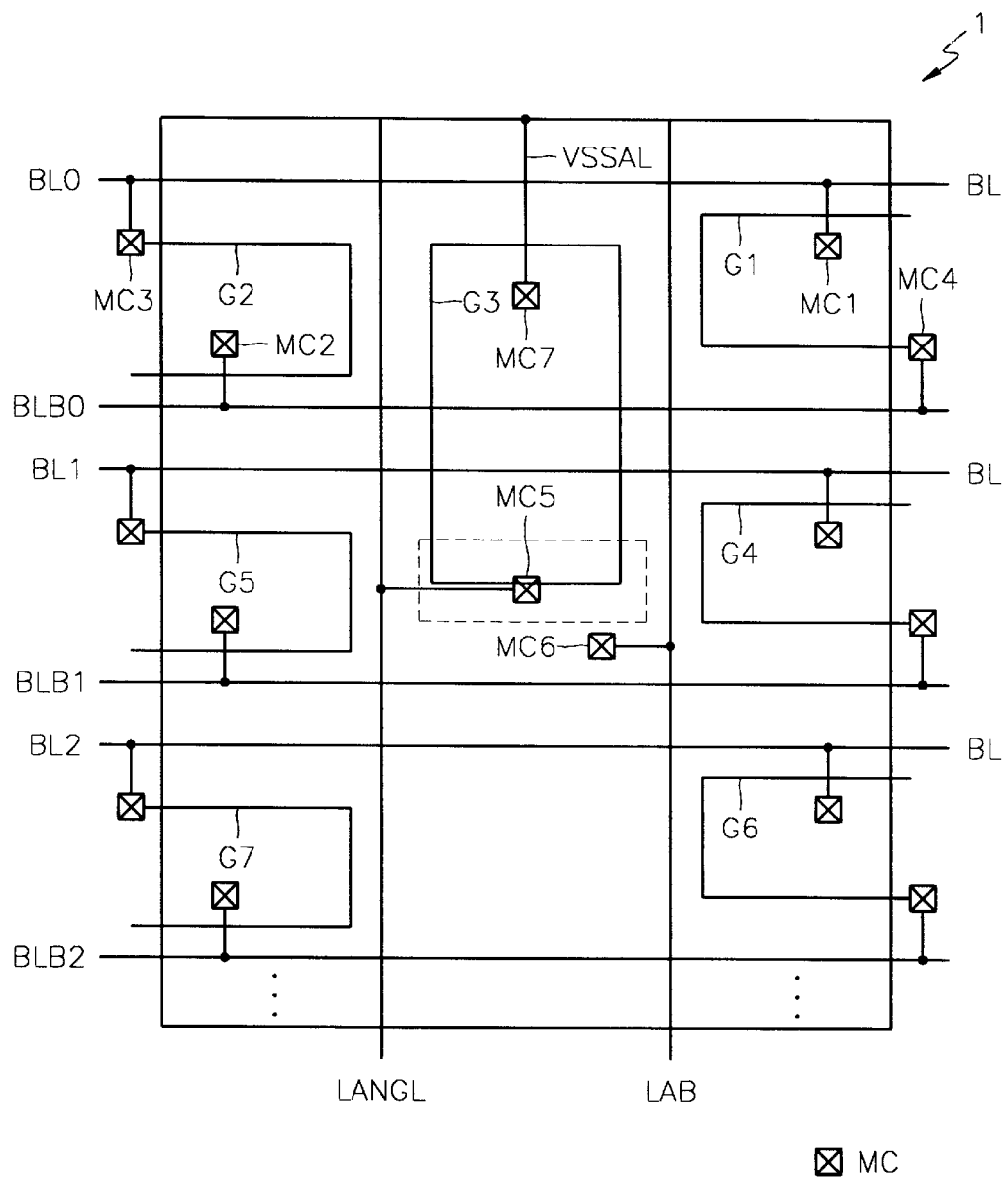
FIG. 2 is a plan view of the layout of the conventional bit line sense amplifier.

The present invention will be described more fully hereinafter with reference to the accompanying drawings in which a preferred embodiment of the invention is shown. Like reference numerals refer to like elements throughout the drawings.

In general, a semiconductor memory device includes a plurality of memory cell arrays in which a plurality of memory cells are arranged in a matrix configuration, a bit line sense amplifier for sensing data stored in the memory cells between the memory cell arrays, and drivers for supplying a predetermined voltage to the bit line sense amplifier.

Figure 3:
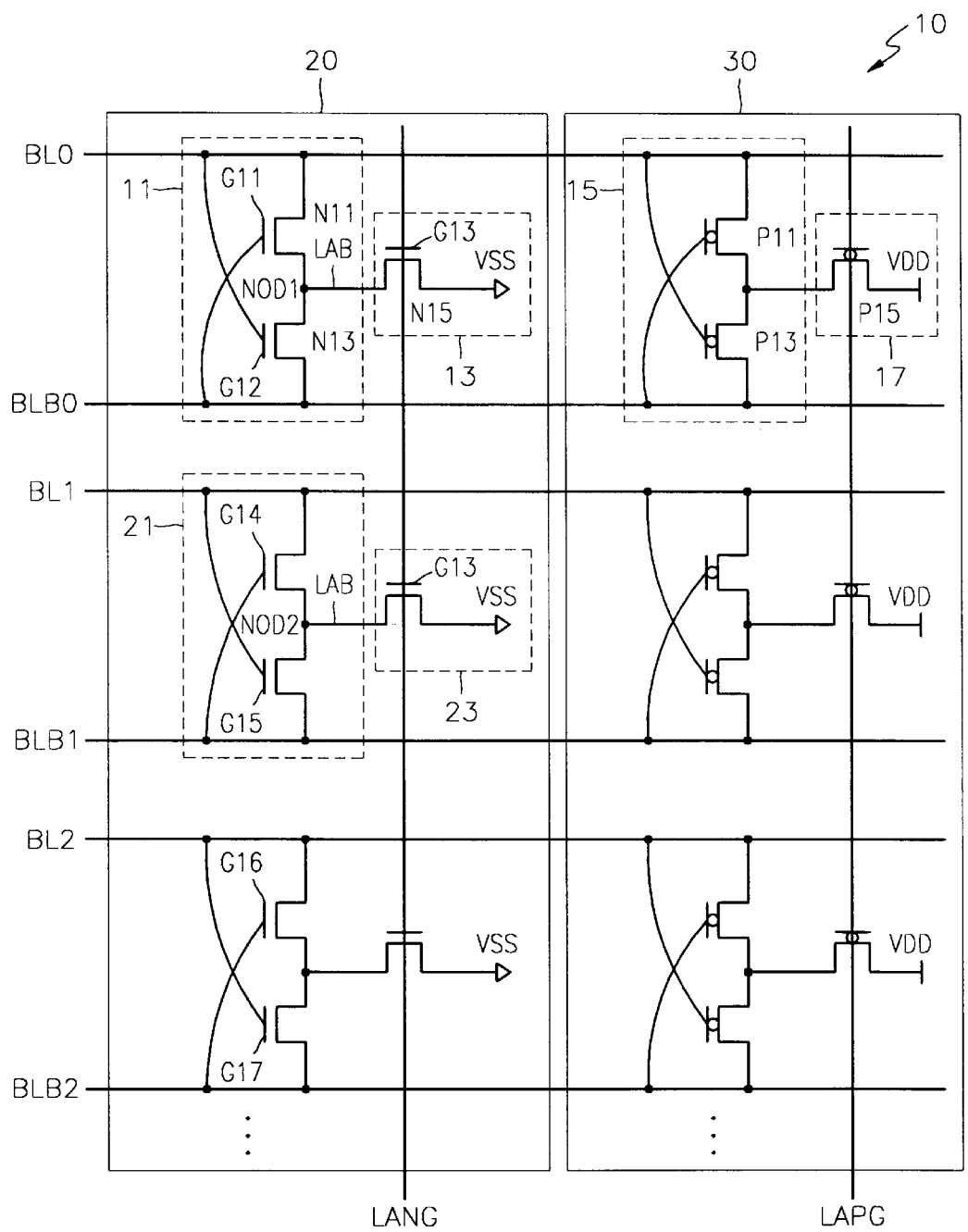
FIG. 3 is a circuit diagram of a bit line sense amplifier according to a preferred embodiment of the present invention.

FIG. 3 is a circuit diagram of a bit line sense amplifier according to a preferred embodiment of the present invention. Referring to FIG. 3, a bit line sense amplifier 10 includes a first sense amplifier block 20 and a second sense amplifier block 30. Preferably, the first and second sense amplifier blocks 20 and 30 are laid out symmetrically.

The first sense amplifier block 20 includes a plurality of NMOS sense amplifiers 11 and 21 and a plurality of drivers 13 and 23, and the second sense amplifier block 30 includes a PMOS sense amplifier 15 and a driver 17.

Figure 4:
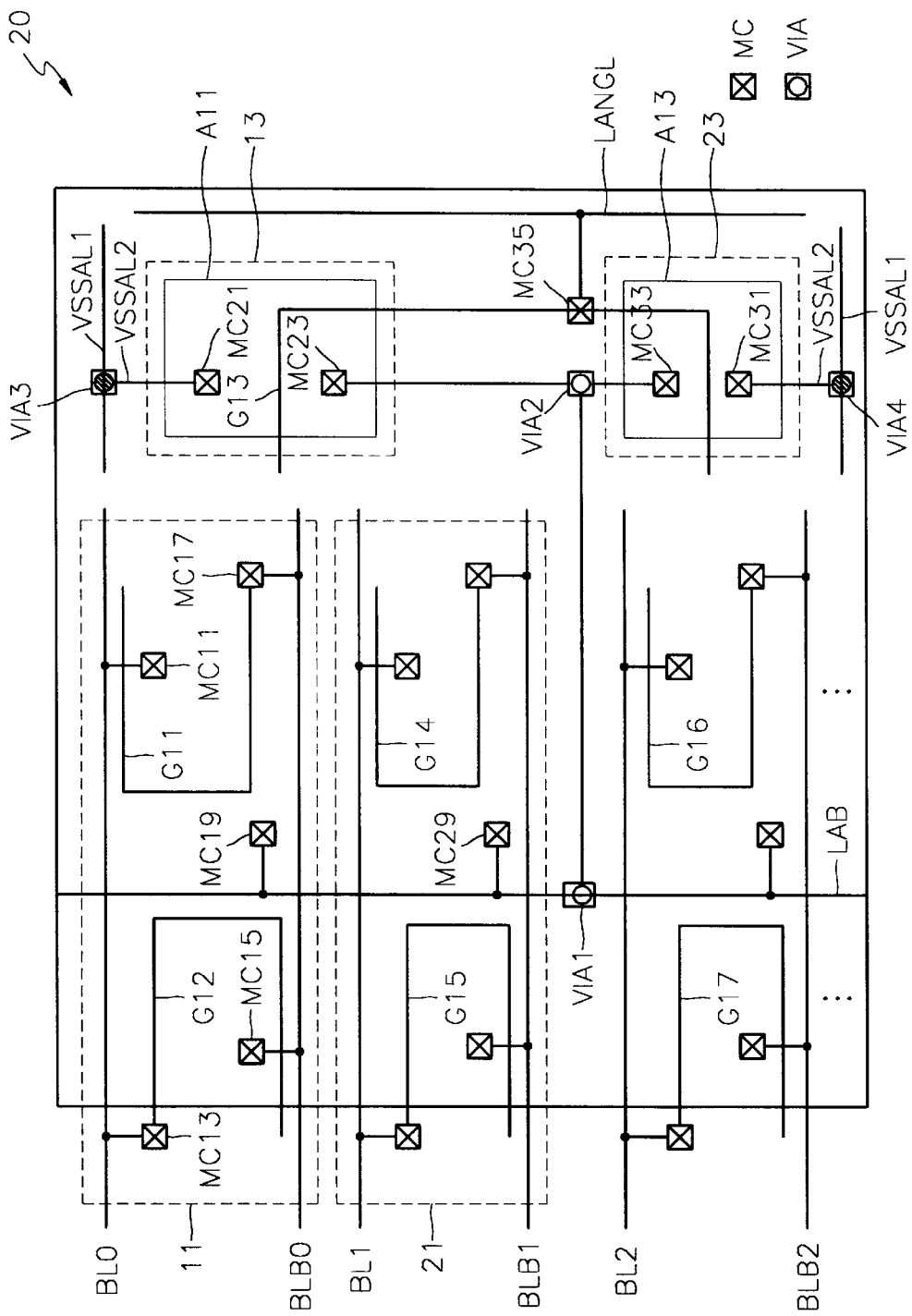
FIG. 4 is a plan view of the layout of a first sense amplifier block of the bit line sense amplifier according to the preferred embodiment of the present invention.

FIG. 4 is a plan view of the layout of the first sense amplifier block 20 according to the preferred embodiment of the present invention. Hereinafter, the layout of the first sense amplifier block 20 will be described in detail.

Referring to FIGS. 3 and 4, the first sense amplifier block 20 includes a plurality of NMOS sense amplifiers 11 and 21 and a plurality of drivers 13 and 23 for supplying a predetermined voltage, for example, a ground voltage VSS, to the NMOS sense amplifiers 11 and 21. The drivers 13 and 23 according to a preferred embodiment of the present invention are arranged outside the NMOS sense amplifiers 11 and 21.

Thus, since the distance between gate G11 and gate G12, the distance between gate G14 and gate G15, and the distance between gate G16 and gate G17 can be equalized, the critical dimensions (CDs) of the gates G11, G12, G14, G15, G16, and G17 can be equalized.

A bit line BL0 is in contact with a gate G12 of an NMOS transistor N13 through a contact MC13 for electrically connecting the bit line BL0 to a given active region and bit line BL0 is in contact with an active region, for example, a drain, of a NMOS transistor N11 through a contact MC11.

A complementary bit line BLB0 is in contact with a gate G11 of the NMOS transistor N11 through a contact MC17 and in contact with an active region, for example, a drain, of a NMOS transistor N13 through a contact MC15.

A first terminal of the driver 13 on an active region A11 is electrically connected to a local power supply transmission line VSSAL2 through a contact MC21, and the local power supply transmission line VSSAL2 is electrically connected to a global power supply transmission line VSSAL1 through a via VIA3.

Further, a second terminal of the driver 13 is electrically connected to a metal line LAB through a contact MC23, a via VIA2, and a via VIA1, and the metal line LAB is electrically connected to a node NOD1 through a contact MC19. A gate G13 of the driver 13 is electrically connected to an enabling signal transmission line LANGL through a contact MC35.

A first terminal of the driver 23 on an active region A13 is electrically connected to the local power supply transmission line VSSAL2 through a contact MC31, and the local power supply transmission line VSSAL2 is electrically connected to the global power supply transmission line VSSAL1 through a via VIA4. The global power supply transmission line VSSAL1 and the local power supply transmission line VSSAL2 transmit a ground voltage VSS.

Further, a second end of the driver 23 is electrically connected to the metal line LAB through a contact MC33, the via VIA2, and the via VIA1, and the metal line LAB is electrically connected to a node NOD2 through a contact MC29. A gate G13 of the driver 23 is electrically connected to the enabling signal transmission line LANGL through the contact MC35.

Figure 5:
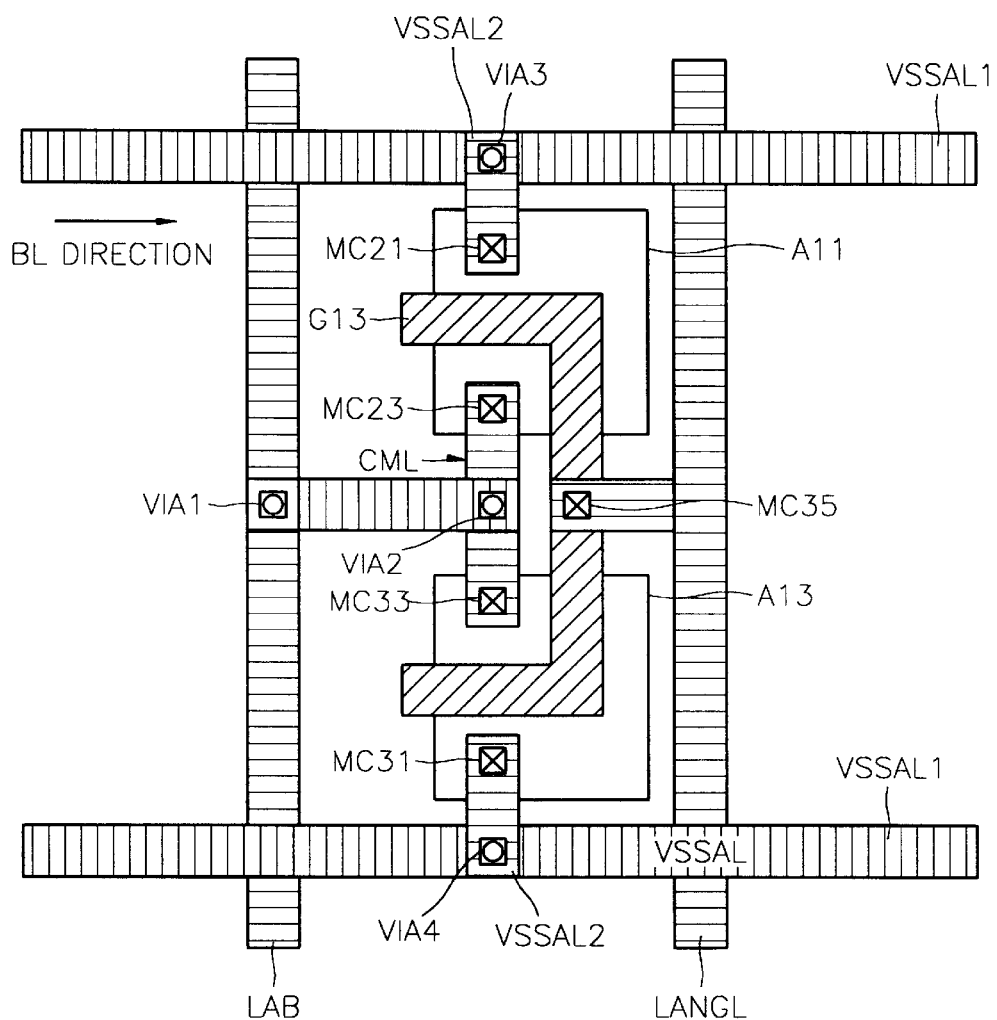
FIG. 5 is a plan view of the detailed layout of the driver of the bit line sense amplifier according to the preferred embodiment of the present invention.

FIG. 5 is a plan view of the detailed layout of a driver of the bit line sense amplifier 10 according to the preferred embodiment of the present invention. Referring to FIGS. 4 and 5, the detailed layout of the drivers 13 and 23 can be easily understood. Gate G13 having a T-shape or a L-shape for reducing the area of the first sense amplifier block 20 is formed on the active regions A11 and A13.

The active region A11 is electrically connected to the local power supply transmission line VSSAL2, which is formed of a first metal, through the contact MC21, and the local power supply transmission line VSSAL2 is electrically connected to the global power supply transmission line VSSAL1, which is formed of a second metal, through the via VIA3.

The gate G13 is electrically connected to the enabling signal transmission line LANGL, which is formed of the first metal, through the contact MC35. A connection metal line CML is electrically connected to the contacts MC23 and MC33 for electrically connecting the active region A11 and the active region A13. The connection metal line CML is also electrically connected to the node NOD1 through the via VIA2, the via VIA1, and the metal line LAB.

Further, the active region A13 is electrically connected to the local power supply transmission line VSSAL2, which is formed of the first metal, through the contact MC31, and the local power supply transmission line VSSAL2 is electrically connected to the global power supply transmission line VSSAL1, which is formed of the second metal, through the via VIA4.

It is preferable that the global power supply transmission line VSSAL1 is is laid out in the same direction as the bit lines BL0–BL2, i.e., parallel to the bit lines BL0–BL2, and the local power supply transmission line VSSAL2 is laid out perpendicular to the global power supply transmission line VSSAL1. It is also preferable that the local power supply transmission line VSSAL2 and the connection metal line CML are arranged along the same line.

The drivers 13, 23, and 17 of the bit line sense amplifier 10 are arranged outside a region in which the NMOS sense amplifiers 11 and 21 and the PMOS sense amplifier 15 are laid out, thereby reducing the area in which the NMOS sense amplifiers 11 and 21 and the PMOS sense amplifier 15 are laid out.

Thus, a difference in a distance from a gate of a column select line to the bit line BL0 or the complementary bit line BLB0 is reduced, and thus resistance mismatch between the bit line BL0 and the complementary bit line BLB0 is reduced.

Further, since the NMOS sense amplifiers 11 and 21 and the PMOS sense amplifier 15 are laid out according to the same pattern, critical dimensions (CDs) of gates of the NMOS sense amplifiers 11 and 21 and the PMOS sense amplifier 15 can be equalized.

Further, since the local power supply transmission line VSSAL2 and the connection metal line CML can be arranged along the same line by laying out a gate having a T-shape or a L-shape of the driver, an active region is reduced, and thus the junction load can be reduced. Thus, noise occurring when data is sensed can be reduced.

As described above, in the bit line sense amplifier according to the preferred embodiment of the present invention, the driver can be arranged outside the bit sense amplifier, thereby minimizing effects caused by variation in CDs of gates and reducing the entire area of the bit line sense amplifier.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A bit line sense amplifier comprising:
    a sense amplifier block in which a plurality of sense amplifiers for sensing and amplifying data of a memory cell are laid out, each sense amplifier including a pair of transistors; and
    drivers corresponding to each of the plurality of sense amplifiers which are laid out outside the plurality of sense amplifiers allowing a distance between pates of the pair of transistors for each of the plurality of sense amplifiers to be equalized, for transmitting a first power supply to each of the sense amplifiers in response to a control signal;
    wherein each of the drivers comprises:
        a global power supply transmission line for supplying the first power supply, which is laid out in a first direction;
        a local power supply transmission line which is laid out in a second direction and connected to the global power supply transmission line at 90 degrees; and
        a via which is connected between the global power supply transmission line and the local power supply transmission line;
    wherein the first power supply is supplied to each of the sense amplifiers through the global power supply transmission line and the local power supply transmission line.

2. A bit line sense amplifier comprising:
    a first sense amplifier block in which a plurality of first sense amplifiers for sensing and amplifying data of a bit line or a complementary bit line are laid out; and
    first drivers for pulling down the bit line or the complementary bit line to a first voltage level, which is lower than a pre-charge voltage in response to a first control signal;
    wherein each of the first drivers is arranged outside the plurality of first sense amplifiers.

3. The bit line sense amplifier as claimed in claim 2, further comprising:
    a second sense amplifier block in which a plurality of second sense amplifiers for sensing and amplifying data of the bit line or the complementary bit line are laid out; and
    second drivers for pulling up the bit line or the complementary bit line to a second voltage level, which is higher than the pre-charge voltage, in response to a second control signal;
    wherein each of the second drivers is arranged outside the plurality of second sense amplifiers.

4. The bit line sense amplifier as claimed in claim 2, wherein the bit line or the complementary bit line includes:
    a global power supply transmission line arranged in the same direction as the bit line; and
    a local power supply transmission line electrically connected to the global power supply transmission line and arranged at a predetermined degree to the global power supply transmission line;
    wherein the bit line or the complementary bit line is pulled down to the first voltage level through the first drivers.

5. The bit line sense amplifier as claimed in claim 2, wherein the first sense amplifier includes:
    a first node;
    a first transistor having a gate connected to the complementary bit line, a first terminal connected to the bit line, and a second terminal connected to the first node; and a second transistor having a gate connected to the bit line, a first terminal connected to the complementary bit line, and a second terminal connected to the first node;

wherein the first drivers include a third transistor having a gate that receives the first control signal, a first terminal connected to the first node, and a second terminal that receives the first voltage level, wherein the gate of the third transistor having a T-shape or an L-shape is laid out on a given active region, and wherein the first voltage level is transmitted to the second terminal of the third transistor through the global power supply transmission line laid out in the same direction as the bit line and the local power supply transmission line laid out perpendicular to the global power supply transmission line and is transmitted to the first node through the first terminal of the third transistor.

6. The bit line sense amplifier as claimed in claim 3, wherein the bit line or the complementary bit line includes:

a global power supply transmission line arranged in the same direction as the bit line; and a local power supply transmission line electrically connected to the global power supply transmission line and arranged at a predetermined degree to the global power supply transmission line;

wherein the bit line or the complementary bit line is pulled up to the second voltage level through the second drivers.

7. The bit line sense amplifier as claimed in claim 3, wherein the second sense amplifier includes:

a second node;

a fourth transistor having a gate connected to the complementary bit line, a first terminal connected to the bit line, and a second terminal connected to the first node; and a fifth transistor having a gate connected to the bit line, a first terminal connected to the complementary bit line, and a second terminal connected to the first node;

wherein the second drivers include a sixth transistor having a gate that receives the second control signal, a first terminal connected to the first node, and a second terminal that receives the second voltage level, wherein the gate of the sixth transistor having a T-shape or an L-shape is laid out on a given active region, and wherein the second voltage level is transmitted to the second terminal of the sixth transistor through the global power supply transmission line laid out in the same direction as the bit line and the local power supply transmission line laid out perpendicular to the global power supply transmission line and is transmitted to the second node through the first terminal of the sixth transistor.

8. A bit line sense amplifier comprising:

a sense amplifier block in which a plurality of sense amplifiers for sensing and amplifying data of a memory cell are laid out, each sense amplifier including a pair of transistors; and a plurality of drivers for transmitting a first power supply to each of the sense amplifiers in response to a control signal, each of the drivers corresponding to and being laid out outside each of the sense amplifiers allowing a distance between gates of the pair of transistors for each of the plurality of sense amplifiers to be equalized.

* * * * *